United States Patent
Prack

(10) Patent No.: US 9,508,667 B2
(45) Date of Patent: Nov. 29, 2016

(54) FORMATION OF SOLDER AND COPPER INTERCONNECT STRUCTURES AND ASSOCIATED TECHNIQUES AND CONFIGURATIONS

(71) Applicant: Intel Corporation, Santa Clara, CA (US)

(72) Inventor: Edward R. Prack, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/581,825

(22) Filed: Dec. 23, 2014

(65) Prior Publication Data

US 2016/0181217 A1 Jun. 23, 2016

(51) Int. Cl.
*H01L 23/00* (2006.01)
*H01L 21/768* (2006.01)
*H01L 23/532* (2006.01)

(52) U.S. Cl.
CPC .............. *H01L 24/11* (2013.01); *H01L 21/768* (2013.01); *H01L 23/53228* (2013.01); *H01L 2224/1132* (2013.01); *H01L 2224/11318* (2013.01); *H01L 2224/11332* (2013.01); *H01L 2224/11505* (2013.01); *H01L 2224/11849* (2013.01); *H01L 2224/13147* (2013.01); *H01L 2924/14* (2013.01)

(58) Field of Classification Search
None
See application file for complete search history.

(56) References Cited

U.S. PATENT DOCUMENTS

| | | | | |
|---|---|---|---|---|
| 6,724,912 B1* | 4/2004 | Carr | ............... | G06K 9/00442 382/100 |
| 7,564,130 B1* | 7/2009 | Li | ............... | H01L 24/14 257/734 |
| 2006/0163744 A1* | 7/2006 | Vanheusden | ........... | B82Y 30/00 257/773 |
| 2007/0062723 A1* | 3/2007 | Kim | ............... | H05K 3/002 174/255 |
| 2012/0309866 A1* | 12/2012 | Jang | ............... | B23K 35/0244 523/160 |
| 2014/0035995 A1* | 2/2014 | Chou | ............... | C09D 11/101 347/20 |

OTHER PUBLICATIONS

"3D Printing Materials Optomec Additive Manufacturing," Copyright 2014 Optomec ,<http://www.optomec.com/additive-manufacturing/printed-electronics/aerosol-jet-materials/> [retrieved Mar. 11, 2015], 5 pages.

"Empower Materials," © 2015 Empower Materials, <http://www.empowermaterials.com/products> [retrieved Mar. 11, 2015], 4 pages.

(Continued)

Primary Examiner — Reema Patel
(74) Attorney, Agent, or Firm — Schwabe, Williamson & Wyatt, P.C.

(57) ABSTRACT

Embodiments of the present disclosure are directed toward formation of solder and copper interconnect structures and associated techniques and configurations. In one embodiment, a method includes providing an integrated circuit (IC) substrate and depositing a solderable material on the IC substrate using an ink deposition process, a binder printing system, or a powder laser sintering system. In another embodiment, a method includes providing an integrated circuit (IC) substrate and depositing a copper powder on the IC substrate using an additive process to form a copper interconnect structure. Other embodiments may be described and/or claimed.

4 Claims, 7 Drawing Sheets

(56) References Cited

OTHER PUBLICATIONS

"Inkjet printer Definition from PC Magazine Encyclopedia," © 1996-2015 Ziff Davis, LLC. PCMag Digital Group,<http://www.pcmag.com/encyclopedia/term/58062/inkjet-printer> [retrieved Mar. 11, 2015], 5 pages.
"Industrial Inkjet Printheads Fujifilm USA," © 2015 FUJIFILM Holdings America Corporation,<http://www.fujifilmusa.com/products/industrial_inkjet_printheads/> [retrieved Mar. 11, 2015], 2 pages.
"Semigear, Inc.," <http://www.semigear.com/index.html>, <http://www.semigear.com/products.html> [retrieved Mar. 11, 2015], 2 pages.
"DM3D Technology," DM3D Technology, LLC is ISO-9001:2008 Certified, <http://www.pomgroup.com/> [retrieved Mar. 11, 2015], 3 pages.
"ExOne Home | ExOne," <http://www.exone.com/> [retrieved Mar. 11, 2015], 4 pages.
"3D printers | 3D models | Rapid Prototyping | voxeljet," <http://www.voxeljet.de/en/systems/3d-druckervx200/> [retrieved Mar. 11, 2015], 17 pages.
"Additive Manufacturing, A Game Changer for the Manufacturing Industry?" Roland Berger Strategy Consultants, Munich, Nov. 2013, 33 pages.
Kim, J., et al., "Direct Laser Metallization with Thin Copper Formate Films," Journal of the Korean Physical Society, 35(5):426-430, Nov. 1999, 5 pages.
Koyama, S., et al., "Effect of Formic Acid Surface Modification on Bond Strength of Solid-State Bonded Interface of Tin and Copper," Materials Transactions, 51(10):1759-1763, Sep. 15, 2010, 5 pages.

\* cited by examiner

FORMATION OF SOLDER AND COPPER INTERCONNECT STRUCTURES AND ASSOCIATED TECHNIQUES AND CONFIGURATIONS

FIELD

Embodiments of the present disclosure generally relate to the field of materials for integrated circuit (IC) assemblies, and more particularly, to formation of solder and copper interconnect structures and associated techniques and configurations.

BACKGROUND

Current techniques to form solder bumps on an integrated circuit (IC) substrate such as a die, wafer, or package substrate may include, for example, plating, paste printing and/or ball placement techniques. Such solder bumping techniques are expensive and complex, particularly for solder bumps having different geometries on a same IC substrate.

Current techniques to form conductive traces such as copper traces of circuits and/or devices may use multiple processes and tools that utilize subtractive processes, which may waste material, resulting in high costs, particularly for low volume production. Screen printing processes have been used to simplify formation of conductive traces; however, screen printing may suffer from yield and/or conductivity issues relative to higher reliability sputter seed and plated traces, which are more costly to produce.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
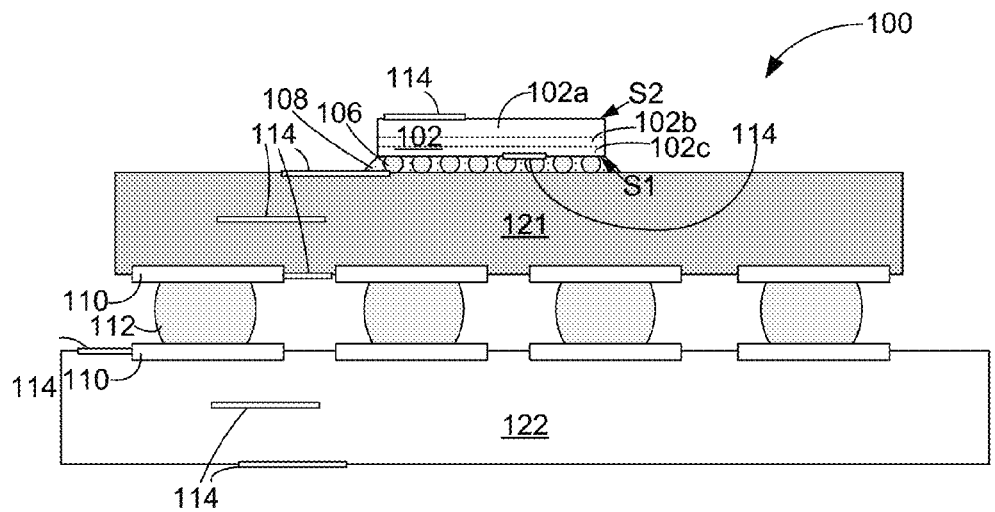
FIG. 1 schematically illustrates a cross-section side view of an example integrated circuit (IC) assembly, in accordance with some embodiments.

Embodiments of the present disclosure describe formation of solder and copper interconnect structures and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100, in accordance with some embodiments. In some embodiments, the IC assembly 100 may include one or more dies (hereinafter "die 102") electrically and/or physically coupled with a package substrate 121. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a processor, memory, SoC, or ASIC.

In some embodiments, an underfill material 108 (sometimes referred to as an "encapsulant") may be disposed between the die 102 and the package substrate 121 to promote adhesion and/or protect features of the die 102 and package substrate 121. The underfill material 108 may be composed of an electrically insulative material and may encapsulate at least a portion of the die 102 and/or die-level interconnect structures 106, as can be seen. In some embodiments, the underfill material 108 is in direct contact with the die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include transistor devices, and an inactive side, S2, may be disposed opposite to the active side S1, as can be seen.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102. In some embodiments, the die-level interconnect structures 106 may include solder bumps formed according to techniques described herein.

In some embodiments, one or more traces 114 may be formed on the die 102 to route electrical signals of the die 102. The one or more traces 114 may include copper traces formed according to techniques described herein. In some embodiments, the one or more traces 114 may be part of a redistribution layer formed on the first side S1 and/or the second side S2 of the die 102.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads 110 or traces 114 disposed on one or more surfaces of the package substrate 121 and/or internal routing features such as, for example, trenches, vias, or other interconnect structures such as traces 114 to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1402 of FIG. 14).

Package-level interconnects such as, for example, solder balls 112 or bumps may be coupled to one or more pads (hereinafter "pads 110") on the package substrate 121 and/or on the circuit board 122 to form corresponding solder joints that are configured to further route the electrical signals between the package substrate 121 and the circuit board 122. The solder joints may be formed according to techniques described herein. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

In some embodiments, the circuit board 122 may include one or more traces 114 to route electrical signals on one or more surfaces of the circuit board 122 and/or through the circuit board 122. The one or more traces 114 may include copper traces formed according to techniques described herein, according to various embodiments.

The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

The present disclosure describes a solder bumping technique using a flux binder. For example, in some embodiments, a flux such as no residue flux (NRF) solder paste may be deposited using an aerosol jet. In some embodiments, a printing method such as an aerosol jet may be used to print solder paste inks in a stabilized suspension to a desired work piece (e.g., wafer, die, or substrate). The work piece may be referred to as an "IC substrate" herein. An ink composed of solder powder and a fluxing binder may be used to form one or more solder interconnect structures (e.g., bumps). A base (stabilizing binder) for the ink may be a flux material such as, for example, NRF. An NRF material may include, for example, a base polymer of polyarylene carbonate (PAC) material and a formic acid fluxing agent. PAC may be an alternative binder material relative to current binder materials and may provide clean decomposition relative to the current binder materials, which may leave a residue. Other suitable NRF materials may be used in other embodiments. The term "ink" as used herein may not include dyes or pigments, in some embodiments, but may refer to a material that is deposited by a process similar to an ink jet printing process such as an aerosol jet printing process. The ink may be deposited to the work piece using any suitable ink deposition system or process, including, for example, ink jet printing or aerosol jet printing. Throughout the disclosure, ink jet printing may be used as an alternative to aerosol jet printing where aerosol jet printing is described. A conventional reflow process may be used to soften and form solder joints using the deposited solderable material.

Figure 2A:
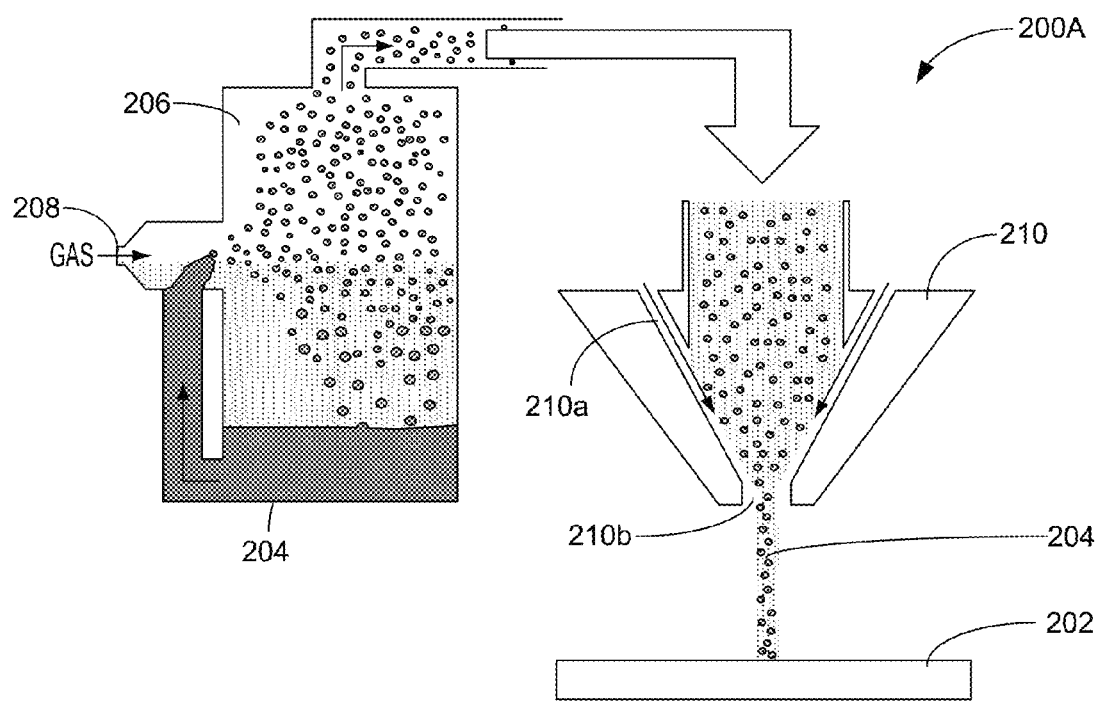
FIG. 2A schematically illustrates an aerosol jet process for depositing a solderable ink on a work piece, in accordance with some embodiments.

Aerosol jet printing may utilize a solder powder baring ink. In one embodiment, a solder powder may be mixed with a flux. FIG. 2A schematically depicts an aerosol jet process for depositing a solderable ink 204 on a work piece 202, according to various embodiments. The work piece 202 (e.g., IC substrate) may be placed and aligned in an aerosol jet printing system 200A and the solderable ink 204 may be deposited at desired locations. According to various embodiments, the printing system 200A may be an aerosol jet printer including a chamber 206 for forming an aerosol including the solderable ink 204. The chamber 206 may have an inlet 208 for a gas that is configured to carry the solderable ink 204 in aerosol form to a print head 210. The print head 210 may include, for example, one or more conduits 210a for a sheath gas to facilitate formation of a focused beam of the solderable ink 204 from an opening in the print head 210. The focused beam of solderable ink 204 may have a width that is less than or equal to 10 microns, in some embodiments. The opening 210b in the print head 210 may be positioned about 3 millimeters (mm) to 5 mm from a surface of the work piece 202 upon which the solderable ink 204 is deposited. Other suitable aerosol jet printing systems may be used to deposit the solderable ink 204 in other embodiments.

Aerosol jet printing of solderable material may provide a variety of benefits. For example, aerosol jet printing of solderable material may be a simpler, drier process compared with vacuum deposition, plating, paste printing or ball placement, which may utilize more steps and, in most cases, may further utilize wet chemical processing. Additionally, the aerosol jet printing process may allow use of a wider variety of metal powder composition for bump formation relative to current material options used in conventional techniques. Furthermore, the aerosol jet printing process may utilize fewer tools relative to conventional techniques. For example, the aerosol jet printing process may utilize a computer-aided design (CAD) file to drive production of an end product. As an additive process, aerosol jet printing may reduce material use relative to conventional techniques, and may provide more flexibility in producing different bump sizes on a same work piece. Using an aerosol jet to print solderable material may further reduce residue associated with deposition and may allow formation of taller bumps (e.g., having higher aspect ratio than conventionally formed solder bumps).

Figure 2B:
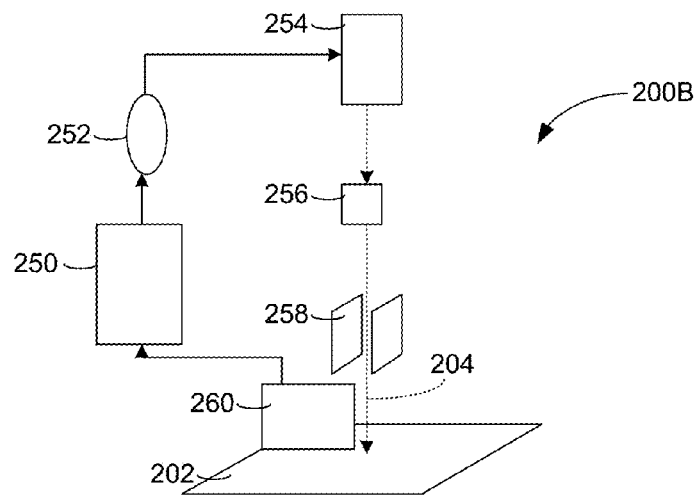
FIG. 2B schematically depicts an inkjet process for depositing a solderable ink on a work piece, according to various embodiments.

FIG. 2B schematically depicts an inkjet process for depositing a solderable ink 204 on a work piece 202, according to various embodiments. The work piece 202 (e.g., IC substrate) may be placed and aligned in an inkjet printing system 200B and the solderable ink 204 may be deposited at desired locations (e.g., according to a pattern in a CAD file). According to various embodiments, the inkjet printing system 200B may be an inkjet printer including an ink reservoir 250 to hold the solderable ink 204. The solderable ink 204 may be pumped in a direction of the arrows by pump 252 towards an ink nozzle 254, which may include a piezoelectric crystal in some embodiments. The ink nozzle 254 may output droplets of the solderable ink 204 to a charging tunnel 256, which may be configured to form a desired pattern of the solderable ink 204 (e.g., according to a CAD file). The charging tunnel 256 may output the solderable ink 204 in droplet form through deflection plates 258 onto the work piece 202. A gutter 260 or other suitable mechanism may collect unused solderable ink 204 and return it to the ink reservoir 250.

In some embodiments, the inkjet printing system 200B may be configured to propel droplets of solderable ink 204 directly onto the work piece 202. The inkjet printing system 200B may operate according to a variety of techniques including, for example, continuous ink or drop on demand techniques.

Figure 3A:
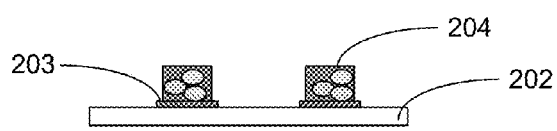
FIG. 3A schematically illustrates solderable ink printed on a work piece by an ink deposition process, in accordance with some embodiments.

FIG. 3A schematically depicts solderable ink 204 printed on a work piece 202 by an ink deposition process (e.g., aerosol jet process or inkjet process of respective FIG. 2A or 2B). The work piece 202 may include electrical contacts 203 such as, for example, pads or traces that are configured to receive deposition of the solderable ink 204.

Figure 3B:
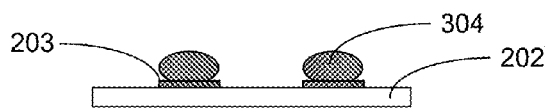
FIG. 3B schematically illustrates solder bumps formed using the deposited solderable ink subsequent to a reflow process, in accordance with some embodiments.

FIG. 3B schematically depicts solder bumps 304 formed using the deposited solderable ink 204 subsequent to a reflow process. Subsequent to deposition of the solderable ink 204, the work piece 202 may be subjected to a reflow process to form solder bumps 304 from the deposited solderable ink 204. In some embodiments, a conventional nitrogen reflow oven may be used to reflow the deposited solderable ink 204.

The present disclosure describes a solder bumping technique using a fluxless reflow. For example, in some embodiments, an ink composed of solder powder and a stabilizing binder that decomposes during reflow may be used to form solder bumps. The stabilizing binder may be stable at room temperature and configured to decompose at an elevated temperature above the room temperature. In some embodiments, a base (e.g., stabilizing binder) for the ink may be a sacrificial tack agent such as PAC in a solvent. The solderable ink may be deposited using any suitable ink deposition system such as, for example, an aerosol jet printing system 200A of FIG. 2A or inkjet printing system 200B of FIG. 2B and may provide similar benefits as described in connection with FIGS. 2A-B.

In one embodiment, a solder powder may be mixed with a sacrificial tack agent to provide a solderable material (e.g., may be referred to as "solderable ink 204") for deposition (e.g., by the aerosol jet printing system 200A or inkjet printing system 200B). The solderable ink 204 may be deposited on a work piece 202 (e.g., IC substrate) and reflowed according to the depictions in FIGS. 3A-B, where during reflow, the sacrificial tack agent (e.g., PAC) may decompose. In some embodiments, a reducing atmosphere reflow system such as, for example, a formic acid reflow system may be used during the reflow process to reduce oxides on the solder.

The present disclosure describes fluxing solder bump formation using a binder printing technique. For example, in some embodiments, binder printing may be performed with solderable material including flux binder, and a conventional reflow process may be used to form one or more solder bumps from the solderable material. A binder print may be used in a powder additive manufacturing process to form solder bumps on a work piece. In some embodiments, a bed of solder powder may be held in place by a binder material. Unbound powder may be removed and resulting bound solder on the work piece may be reflowed. In some embodiments, the binder material may be a flux material such as NRF or non-NRF material.

Figure 4:
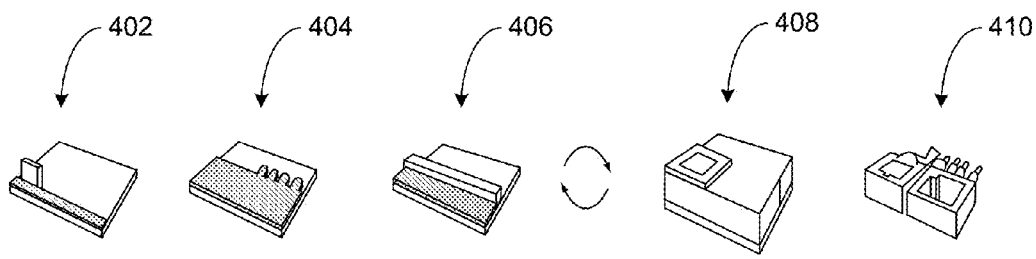
FIG. 4 schematically illustrates a binder print process, in accordance with some embodiments.

FIG. 4 depicts a binder print process, according to some embodiments. A work piece may be placed in a build box and aligned. At 402, solder powder may be spread in the build box on the work piece. A binder material may be selectively dispensed using, for example, ink deposition technology (e.g., aerosol jet printing system 200A of FIG. 2A or inkjet printing system 200B of FIG. 2B) according to a desired pattern. For example, the binder material may be patterned into the powder based on a CAD file. In some embodiments, the binder material may be a fluxing material such as, for example, water soluble (WS), no clean (NC) or NRF material. In some embodiments, the binder material may have a tackiness that holds shape over a period of time associated with the binder print process.

At 404, a build platform of the build box may be lowered by an increment to allow spreading of another layer of solder powder at 406. At 408, actions at 402, 404, 406 may be sequentially repeated until a solderable structure is formed for reflow. At 410, loose solder powder (e.g., unbound solder powder) may be removed and may be re-used in another binder print process and a reflow process may be performed, such as, for example, a forced gas reflow oven in nitrogen or air.

Binder printing of solderable material may provide a variety of benefits. For example, a binder printing technique may be relatively simple and dry relative to alternatives such as vacuum deposition, plating, paste printing or ball placement, which may use wet chemical processing. Additionally, the binder printing process may allow use of a wider variety of metal powder composition for bump formation relative to current material options used in conventional techniques. Furthermore, the binder printing process may utilize fewer tools relative to conventional techniques. For example, the binder print process may utilize a computer-aided design (CAD) file to drive production of an end product. As an additive process, binder printing may reduce material use relative to conventional techniques, and may provide more flexibility in producing different bump sizes on a same work piece. Using binder printing may further reduce residue associated with deposition and may allow formation of taller bumps (e.g., having higher aspect ratio than conventionally formed solder bumps). Binder printing may result in higher throughput for the formation of bumps having different sizes relative to conventional techniques, and may result in higher quality solder bumps at a potentially lower cost.

The present disclosure describes binder printing with solderable material including a sacrificial tack binder for solder bump formation. For example, in some embodiments, binder printing may be performed using PAC and a fluxless reflow. In some embodiments, a bed of solder powder may be held in place by a binder material. Unbound powder may be removed and resulting bound solder on the work piece may be reflowed. In some embodiments, the binder material may be a sacrificial tacking material. If the tacking material is not fluxing, a formic acid (FA) reflow system may be used to reflow the bound material to allow the FA environment to reduce any oxides formed on the solder powder.

The binder material may be a PAC material, which may have high tack properties and controlled burnout resulting in void free parts with the decomposition products being carbon dioxide and water. An advantage of PAC material over other solder flux materials is that the PAC material may be stored at room temperature in a stable manner over long periods and may result in less residue relative to other solder flux materials. Use of a reducing atmosphere such as formic acid reflow may decouple fluxing from the tack agent and allow for effective fluxing of solder powder during reflow.

Figure 5:
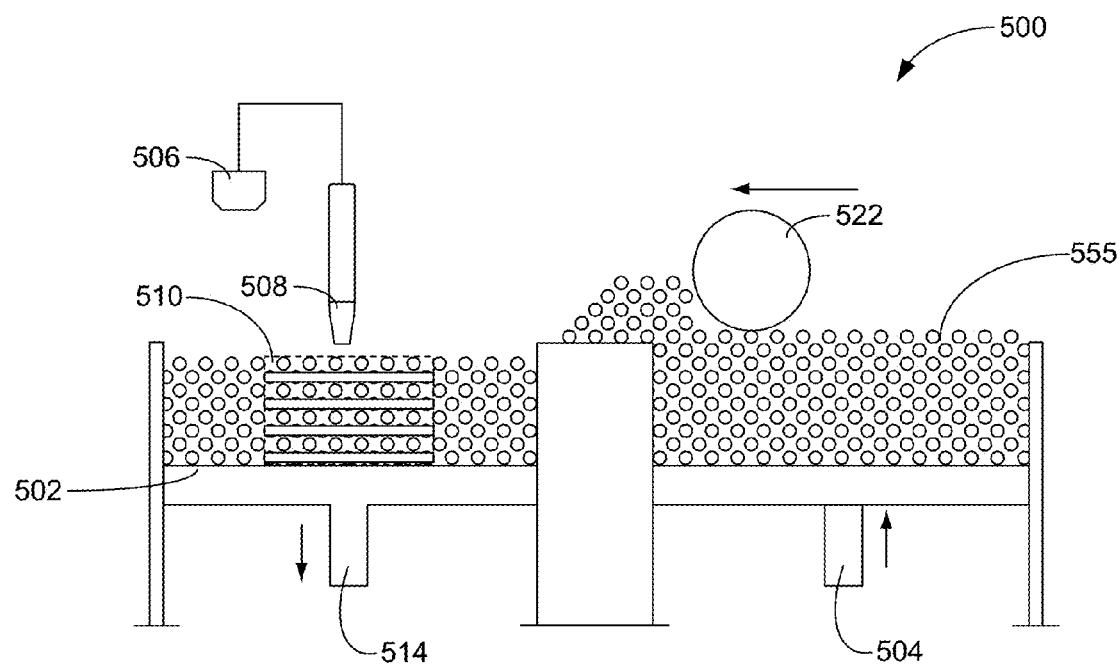
FIG. 5 schematically illustrates a binder printing system that may be used to perform binder printing, in accordance with some embodiments.
Figure 6:
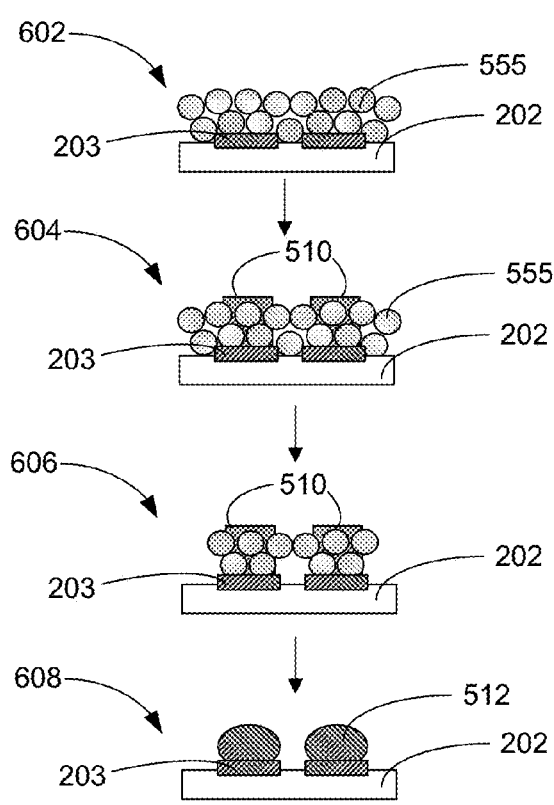
FIG. 6 schematically illustrates a binder print process, in accordance with some embodiments.

According to various embodiments, the binder print process described in connection with FIG. 4 may be used to form solder bumps with binder material using a sacrificial tack binder such as PAC and a fluxless reflow. FIG. 5 schematically depicts a binder printing system 500 that may be used to perform binder printing, in accordance with some embodiments. For example, in some embodiments, a binder printing system as manufactured by ExOne™ and/or VoxelJet™ may be used. Other suitable binder printing systems may be used in other embodiments. FIG. 6 depicts a binder print process, in accordance with some embodiments.

Referring to FIGS. 5 and 6, at 602, a binder print process may include placing solder powder 555 in a bed 502 (which may be referred to as a "build box"). The powder may have a diameter on the order of microns in some embodiments, but may include other suitable dimensions in other embodiments. For example, a piston 504 may be activated to deliver solder powder 555 in a container upwards such that a roller 522 or other suitable displacement mechanism can move the solder powder 555 into the bed 502. A work piece 202 may be aligned and disposed in the bed 502 to receive the solder powder 555.

At 604, binder printing may be performed in the powder bed 502 to define bumps (e.g., on contacts 203 on the work piece 202). For example, a binder supply 506 may be coupled with a nozzle 508 to deposit a binder in a desired printing pattern to define solder bumps. In some embodiments, the nozzle 508 may be configured to print/deposit flux and/or a sacrificial tack agent. The printed binder may form one or more scaffold structures 510 of the solder powder 555 held together by the binder that, on reflow at 608, are converted to one or more corresponding solder bumps 512. In some embodiments, the nozzle 508 may be a print head (e.g., print head 210 of FIG. 2A) of an aerosol jet printing system (aerosol jet printing system 200A of FIG. 2A) or nozzle of an inkjet printing system (e.g., inkjet printing system 200B of FIG. 2B).

At 606, unbound solder powder (e.g., not printed with binder) may be removed from the work piece 202 leaving the one or more scaffold structures 510. Actions at 602, 604 and 606 may be repeated until a desired height or other dimension of the one or more scaffold structures 510 is achieved. For example, a piston 514 may be configured to move the bed 502 downwards for layering of more solder powder 555 and binder on the work piece 202.

At 608, a reflow process may be performed to form solder bumps 512 using the one or more scaffold structures 510. In some embodiments, the reflow process may be performed in a reducing atmosphere to form the solder bump.

The present disclosure describes additive manufacturing techniques to form solder bumps. For example, in some embodiments, laser sintering of solder powder ("powder laser sintering") may be used to form solder bumps. In some embodiments, a post sintering reducing process may be performed. In some embodiments, a bed of solder powder may be laser sintered in place (referred to herein as "powder-bed laser sintering process") or a powder jet that is sintered at a powder focal area may be used (referred to herein as "powder-jet laser sintering process"). A controlled environment may be used to reduce formation of oxide on the bumps during sintering and/or oxides may be removed using a reducing atmosphere during reflow of finished, sintered bumps.

Figure 7:
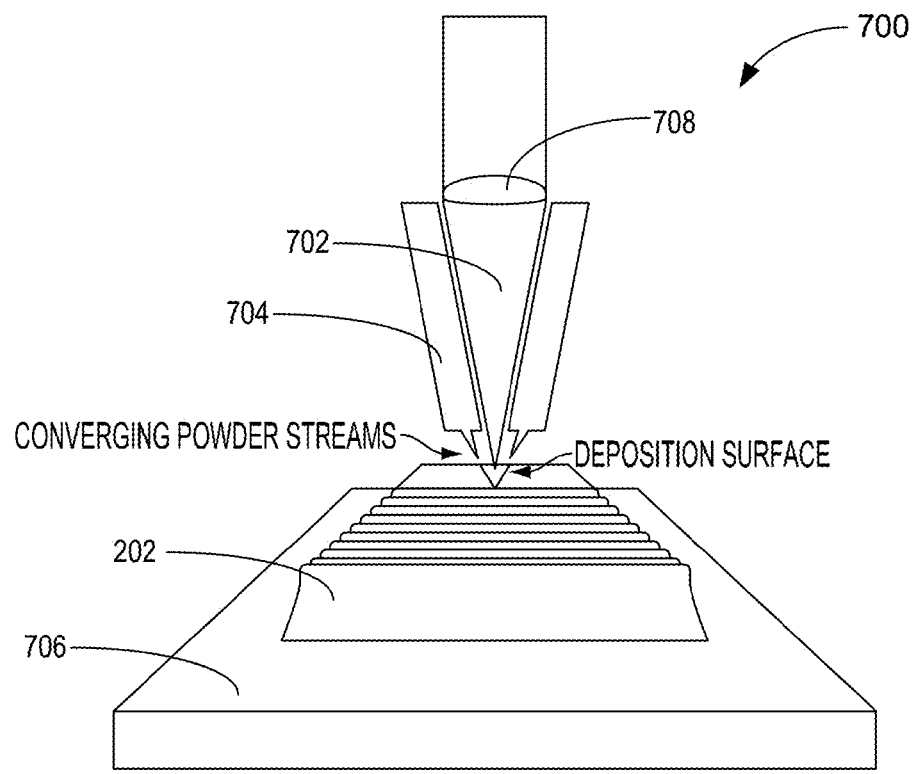
FIG. 7 schematically illustrates a powder-jet laser sintering system, in accordance with some embodiments.

FIG. 7 depicts a powder-jet laser sintering system 700, in accordance with some embodiments. The powder-jet laser sintering system 700 may include a focused laser beam 702, a nozzle 704 configured to deliver solder powder at a convergence of the focused laser beam 702 and a deposition surface of a substrate such as an integrated circuit substrate (e.g., work piece 202) disposed on a stage 706, which may be configured to precisely move to provide a desired pattern of sintering of solder powder on the deposition surface of the work piece 202 in some embodiments. The powder-jet laser sintering system 700 may include a focus lens 708 to provide the focused laser beam 702.

In some embodiments, the powder-jet laser sintering system 700 may be a directed energy deposition (DED) system. Other suitable laser sintering systems may be used to form solder bumps, according to various embodiments. For example, a direct metal deposition (DMD) technique may include cameras that measure height of a melt of the solder powder and adjust laser power to maintain even height during sintering.

Figure 8:
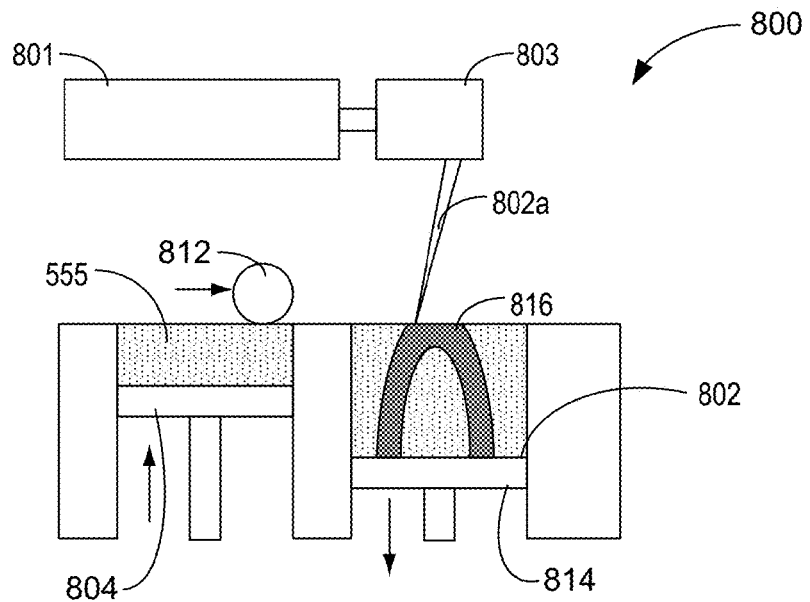
FIG. 8 schematically illustrates a powder-bed laser sintering system, in accordance with some embodiments.

FIG. 8 depicts a powder-bed laser sintering system 800, in accordance with some embodiments. The powder-bed laser sintering system 800 may include a bed 802 (which may be referred to as a "build box") configured to receive and hold solder powder 555. The solder powder 555 may have a diameter on the order of microns in some embodiments, but may include other suitable dimensions in other embodiments. A piston 804 may be configured to deliver solder powder 555 in a container upwards such that a roller 812 or other suitable displacement mechanism can move the solder powder 555 into the bed 802. A work piece 202 may be aligned and disposed in the bed 802 to receive the solder powder 555. Another piston 814 may be configured to drive the bed 802 in a manner such that a laser source 801 and/or scanner 803 can form a laser beam 802a to sinter solder powder 555 in the bed 802 to form one or more solder bumps 816. In some embodiments, the powder-bed laser sintering system 800 may be a powder bed fusion (PBF) system. Other suitable powder-bed laser sintering systems may be used in other embodiments.

Figure 9:
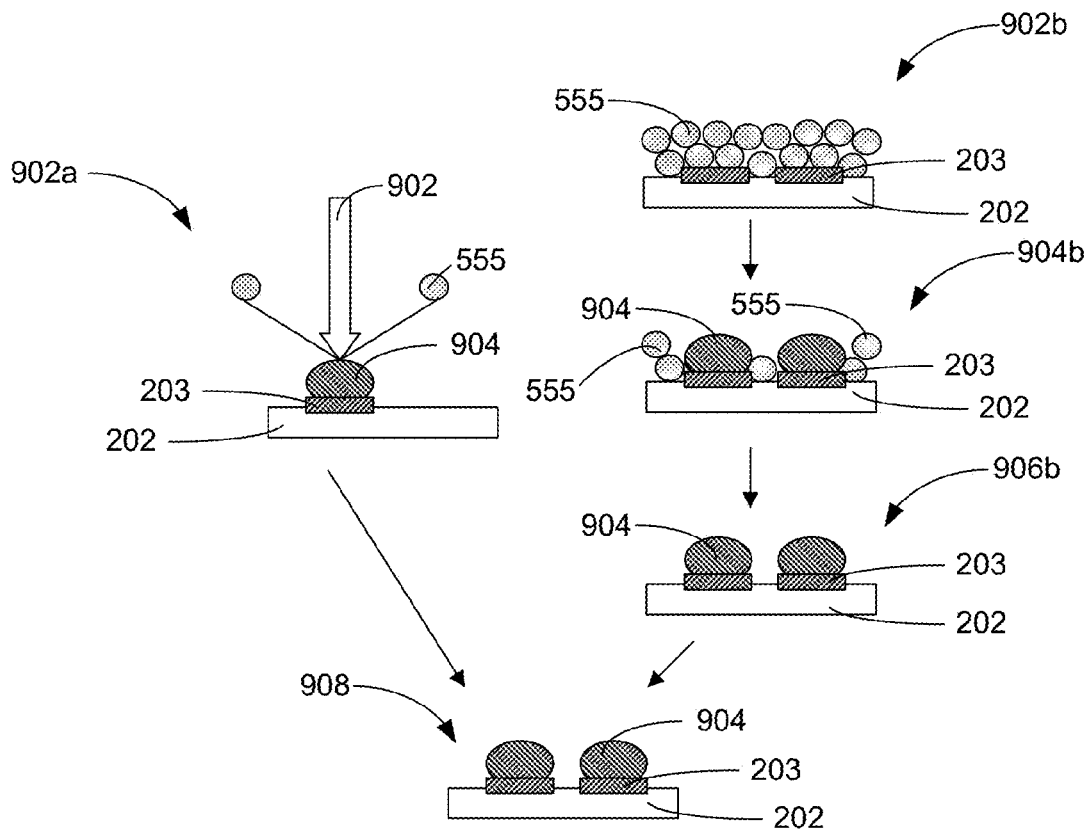
FIG. 9 schematically illustrates powder laser sintering techniques, in accordance with some embodiments.

FIG. 9 depicts powder laser sintering techniques, in accordance with some embodiments. Action at 902a may depict a powder-jet technique (e.g., using a powder-jet laser sintering system 700 of FIG. 7) and actions at 902b, 904b and 906b may depict a powder-bed technique (e.g., using a powder-bed laser sintering system 800 of FIG. 8). Each of the powder-jet technique and the powder-bed technique may be used to form one or more solder bumps 904 at 908. According to various embodiments, the solder powder 555 may have a protective coating to avoid agglomeration and/or formation of larger particles.

First, the powder-jet technique is described. At 902a, a work piece 202 having one or more contacts 203 may be placed and/or aligned on a stage (e.g., stage 706 of FIG. 7) of a powder-jet laser sintering system (e.g., powder-jet laser sintering system 700 of FIG. 7). Solder powder 555 may be selectively deposited (e.g., sprayed) to a sintering area in the path of a laser 902 (e.g., focused laser beam 702 of FIG. 7) to form solder bumps 904 on the one or more contacts 203. In some embodiments, the laser may be focused to a size with submicron dimensions. Depositing the powder and sintering to form the solder bumps 904 may be simultaneously performed.

Next, the powder-bed technique is described. At 902b, a work piece 202 having one or more contacts 203 may be placed and/or aligned in a build box (e.g., bed 802 of FIG. 8) filled with solder powder 555. At 904b, the solder powder 555 is sintered by a laser (e.g., laser beam 802a of FIG. 8) to form solder bumps 904 on the one or more contacts 203. At 906b, excess solder powder 555 may be removed from the work piece 202.

At 908, post processing may be performed after formation of the solder bumps 904 using the powder-jet technique or powder-bed technique. For example, one approach to reduce agglomeration and formation of larger particles from the solder powder 555 (e.g., one or more of solder bumps 904 are oxidized) may be to reflow the solder bumps 904 in a reducing atmosphere such as, for example, formic acid reflow, to reduce oxides in sintered solder bumps 904.

In some embodiments, the powder laser sintering process may include a powder-jet technique where sintering of the solder powder takes place at a sintering area where a laser (e.g., laser 902 of FIG. 9) meets solder powder (e.g., solder powder 555 of FIG. 9) with a reducing agent entrained in the powder flow. Using a reducing agent may result in reduction of oxide that may be formed on the solder bumps 904 and/or contacts 203. For example, in this manner, actions at 902a and 908 may be combined into a single process.

In some embodiments, the reducing agent may include, for example, formic acid entrained in a gas flow (e.g., nitrogen gas flow) that may be used as an input gas (e.g., in nozzle 704) for delivery of the solder powder 555 to the sintering area such that laser sintering of the powder at 902a is performed in a reducing atmosphere created by the laser sintering in the presence of the reducing gas. Such technique may allow for use of oxidized solder powder for flowability and sphere integrity in the powder-jet laser sintering system and removal of the oxides during the sintering process. The gas flow and the reducing agent may include other suitable materials in other embodiments.

In some embodiments, a reducing agent in the powder flow may be used in connection with aerosol jet printing or inkjet printing as described in connection with FIGS. 2A-B to facilitate oxide removal from solder bumps. For example, in some embodiments, the reducing agent may be added to a sheath gas through one or more conduits (e.g., conduits 210a of FIG. 2A) for a sheath gas in the print head (e.g., print head 210 of FIG. 2A) and/or added to a gas (e.g., at inlet 208 of FIG. 2A) that is configured to carry solderable ink in aerosol form to the print head.

In some embodiments, solder bumps formed by powder laser sintering (e.g., sintered solder bumps) in a reducing atmosphere from powder may have less or no residue from flux relative to conventional solder bumps formed from paste or components of a plating process for plated bumps that are subsequently reflowed (e.g., typically with flux). Powder laser sintering (e.g., using the powder-jet technique or powder-bed technique) to form solder bumps 904 may provide a variety of benefits. For example, powder laser sintering may be relatively simple and dry relative to alternatives such as vacuum deposition, plating, paste printing or ball placement, which may include more steps and may use wet chemical processing. Additionally, powder laser sintering may allow use of a wider variety of metal powder composition for bump formation relative to current material options used in conventional techniques. Furthermore, powder laser sintering may utilize fewer tools relative to conventional techniques. For example, powder laser sintering may utilize a computer-aided design (CAD) file to drive production of an end product. As an additive process, powder laser sintering may reduce material use relative to conventional techniques, and may provide more flexibility in producing different bump sizes on a same work piece. Using powder laser sintering may further reduce residue associated with deposition and may allow formation of taller bumps (e.g., having higher aspect ratio than conventionally formed solder bumps). Powder laser sintering may result in higher throughput for the formation of bumps having different sizes relative to conventional techniques and/or may result in higher quality solder bumps at a potentially lower cost.

The present disclosure describes formation of copper interconnect structures such as copper traces (e.g., traces 114 of FIG. 1) using additive processes. For example, conductive ink techniques or direct copper deposition using powder additive manufacturing techniques such as sintering may be used. Copper traces may be formed using a conductive ink technique followed by reducing atmosphere processing, in one embodiment. In another embodiment, copper traces may be formed using a conductive ink technique with a self-reducing ink formulation such as, for example, copper ink with NRF to reduce copper using a reflow (e.g., thermal treatment) post process. In another embodiment, copper traces may be formed using reducing agents in powder flow for powder sintering.

According to various embodiments, an ink printing process with a copper-based ink may be used to form copper traces. The copper-based ink may be cured or otherwise processed in a reducing atmosphere to reduce copper oxidation. Copper oxidation may lower electrical conductivity of copper traces. Use of a reducing atmosphere cure or other reducing atmosphere may reduce the oxidized copper and allow use of copper oxide nano-particles instead of copper nano-particles. The copper oxide nano-particles may be less costly.

A copper-based ink may be deposited according to any suitable ink printing process. In some embodiments, copper particles in the ink may have a protective polymer coating. For example, ink jet or aerosol jet printing processes may be used and may not require plates or associated tooling. In some embodiments, the techniques described in connection with FIGS. 2A-B and 3A-B may be used where the solderable ink 204 is replaced with a copper-based ink that includes particles of copper. The deposited copper-based ink may be cured in a reducing atmosphere such as, for example, formic acid reflow (which may be used for a flexible substrate such as polyimide-based substrates) or an atmospheric plasma system. For example, atmospheric pressure hydrogen plasma may remove oxide from copper and other metals at low temperature without damage to other components of a work piece.

In some embodiments, a copper-based ink may be formulated using copper nano-particles in any suitable carrier fluid. The copper-based ink may include or not include a polymer protective coating on the copper particles in the ink. In some embodiments, the copper-based ink may include copper oxide particles. The copper-based ink may be deposited on a work piece according to a desired pattern using any suitable ink deposition technique including, for example, ink jet or aerosol jet printing techniques. Subsequent to deposition on the work piece, the copper-based ink may be cured by any suitable technique including, for example, laser, ultraviolet (UV) or thermal cure techniques. In one embodiment, curing may be performed in a reducing atmosphere such as formic acid or other suitable reducing atmosphere. In a case where cure in reducing atmosphere is not used, reduction of copper oxide may be subsequently performed after the cure using, for example, formic acid reflow or atmospheric plasma such as a 1% $H_2$ mixture. The reducing atmosphere may reduce oxides, allowing better conductive contact of the copper nano-particles, which may reduce resistance between the copper nano-particles for improved electrical flow. In some embodiments, morphology and oxide at an interface between the copper nano-particles may have less oxide in regions between copper particles relative to copper nano-particles that are not processed according to techniques described herein. Using a copper-based ink deposition to form copper traces may be a lower cost method relative to conventional techniques, particularly for low volume and/or customized products.

In some embodiments, copper-based ink deposition may be used in conjunction with a self-reducing ink formulation. For example, a copper-based ink formulation may include nano-particles of copper with a carrier that is configured to remove oxide in a processing step subsequent to deposition of the copper-based ink to improve electrical and/or thermal performance of resulting copper interconnect structures such as copper traces. In some embodiments, a copper-based ink formulation may include copper nano-particles, which may have an optional protective polymer coating, and/or may include copper oxide nano-particles, a NRF carrier material including, for example, polypropylene carbonate (PPC), solvent such as, for example, gamma-Butyrolactone (GBL) or acetone, and/or a copper reducing agent such as, for example, formic acid.

NRF material may reduce copper oxides during reflow of a deposited copper-based ink. NRF materials may be based on a thermoplastic suspended in a solvent with a reducing agent. For example, PPC may include a thermoplastic that is tacky and decomposes to carbon dioxide and water. In one embodiment, formic acid is used as a fluxing agent in NRF. Formic acid may be a highly reactive organic acid and may remove oxide from copper resulting in carbon dioxide reaction products.

According to some embodiments, the copper-based ink may be deposited on a work piece using ink jet or aerosol jet printing techniques according to a desired pattern (e.g., from a CAD file). Subsequent to deposition, a post processing process may be performed to reduce copper oxide and provide better contact between the copper nano-particles. In some embodiments, the post processing temperature may be greater than 200° C. to allow reduction of oxides using formic acid. In some embodiments, a lower temperature (e.g., less than 250° C.) cure may be used to retain some of the PPC to adhere to the substrate and protect the copper nano-particles that have been brought into closer conductive contact with each other. In some embodiments, residual protective PPC may be found in copper traces of a final product (e.g., work piece ready for shipping to customer).

In some embodiments, the present disclosure describes direct copper deposition using a powder additive manufacturing process with reducing agents in the powder flow for powder sintering. In some embodiments, a copper powder jet may be sintered at a powder focal area. For example, a sintering process could be performed at a sintering area with a reducing agent entrained in the powder flow, which may result in reduction of oxides on the copper powder allowing for a single-step process for formation of conductive copper structures (e.g., copper traces) on a work piece. Additional gas may be added to promote better adhesion to surfaces such as, for example, high temperature polymers (e.g., polyimide) such that the laser plume in the gas results in surface modification of a surface of the work piece resulting in better adhesion of the copper to the surface.

According to various embodiments, copper powder may be deposited to form copper trace structures using any suitable powder delivery system including, for example, an aerosol jet printing system (e.g., aerosol jet printing system 200A of FIG. 2A), powder-jet laser sintering system (powder-jet laser sintering system 700 of FIG. 7) or a DMD laser sintering system. According to some embodiments, the copper powder may be deposited and sintered using techniques described in connection with FIG. 9 (e.g., 902a of FIG. 9). For example, a powder delivery system may be charged with a metal powder (e.g., copper). An input gas may use an FA-entrained inert gas (e.g., nitrogen) flow to allow for reduction of metal oxides and a surface of any contacts (e.g., pad) upon which the copper may be deposited. Additional components (e.g., nitrogen) can be added to the input gas to promote adhesion of copper to the work surface. The powder flows may be impinged on areas for metal deposition and a laser may be applied to sinter the powder in place in the reducing atmosphere created by the laser sintering in the presence of the reducing gas. Higher laser power may be used to attain copper sintering for powder including copper oxide particles relative to powder including copper.

Copper deposition using a powder additive manufacturing process with reducing agents in the powder flow for powder sintering may provide a variety of benefits. For example, such process may be a simpler, drier process compared with vacuum deposition, plating, paste printing or ball placement, which may utilize more steps and, in most cases, may further utilize wet chemical processing. Furthermore, such process may utilize fewer tools relative to conventional techniques. For example, such process may utilize a computer-aided design (CAD) file to drive production of an end product. As an additive process, such process may reduce material use relative to conventional techniques, and may provide more flexibility in producing different copper structure sizes on a same work piece. Providing a reducing gas to the powder feed flow may result in a single process that would not require subsequent sintering to attain electrical and thermal conductivity. The addition of a reducing gas to the powder feed may facilitate the use of lower cost powder such as copper oxide as opposed to pure copper powder. Using an aerosol jet to print solderable material may further reduce residue associated with deposition and may allow formation of taller bumps (e.g., having higher aspect ratio than conventionally formed solder bumps).

Figure 10:
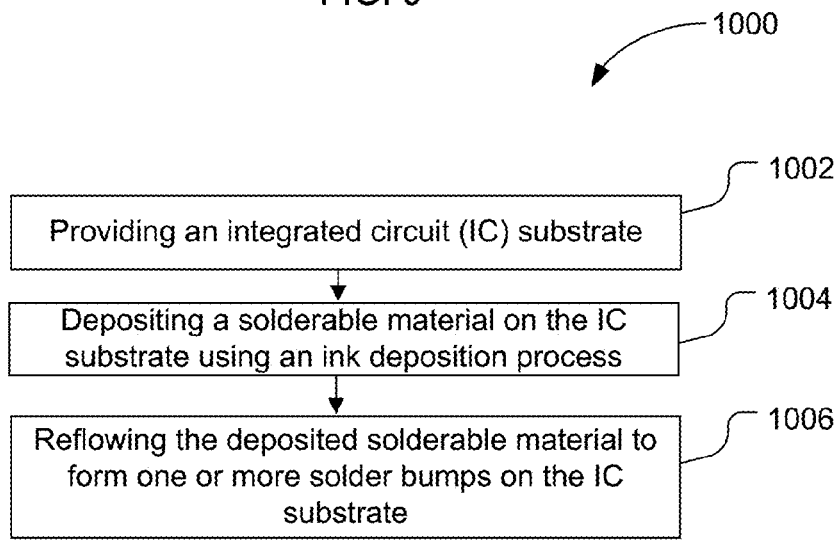
FIG. 10 schematically illustrates a flow diagram for a method of forming one or more solder bumps on an integrated circuit (IC) substrate using an ink deposition process, in accordance with some embodiments.

FIG. 10 schematically illustrates a flow diagram for a method 1000 of forming one or more solder bumps (e.g., solder bumps 304 of FIG. 3B) on an integrated circuit (IC) substrate (e.g., work piece 202 of FIGS. 3A-B) using an ink deposition process (e.g., aerosol jet process or inkjet process of respective FIG. 2A or 2B), in accordance with some embodiments. The method 1000 may comport with embodiments described in connection with FIGS. 2-3B or elsewhere herein and vice versa.

At 1002, the method 1000 may include providing an integrated circuit (IC) substrate. The IC substrate may include, for example, a die, wafer, package substrate, circuit board, or any other suitable IC substrate.

At 1004, the method 1000 may include depositing a solderable material on the IC substrate using an aerosol jet printing system. For example, the solderable material may include a solder powder mixed with a flux material and/or binder. The solderable material may be deposited according to techniques described in connection with FIGS. 2A-B and FIG. 3A or elsewhere herein. In some embodiments, the solder powder may be mixed with a stabilizing binder that is stable at room temperature and configured to decompose during a reflow process. The solderable material may be deposited according to a CAD file in some embodiments.

At 1006, the method 1000 may include reflowing the deposited solderable material to form one or more solder bumps on the IC substrate. The reflow process may comport with embodiments described in connection with FIGS. 2A-B and FIG. 3B or elsewhere herein.

Figure 11:
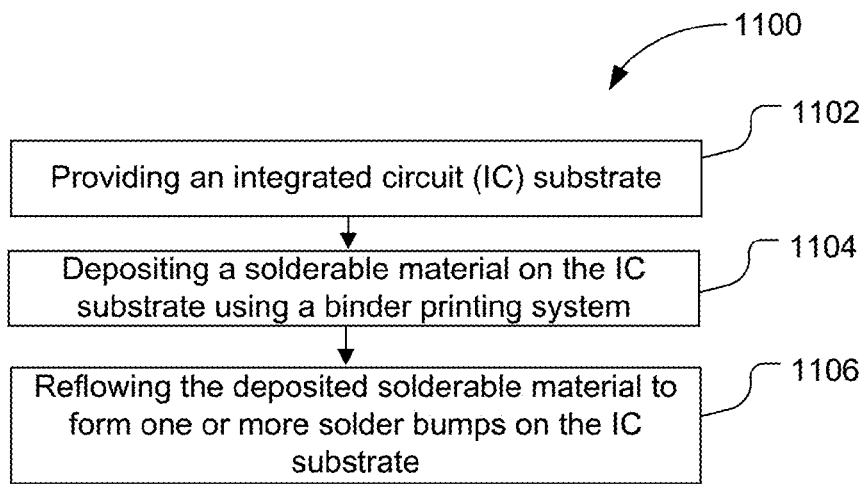
FIG. 11 schematically illustrates a flow diagram for a method of forming one or more solder bumps on an integrated circuit (IC) substrate using a binder printing system, in accordance with some embodiments.

FIG. 11 schematically illustrates a flow diagram for a method 1100 of forming one or more solder bumps (e.g., solder bumps 512 of FIG. 6) on an integrated circuit (IC) substrate (e.g., work piece 202 of FIG. 6) using a binder printing system (e.g., binder printing system 500 of FIG. 5), in accordance with some embodiments. The method 1100 may comport with embodiments described in connection with FIGS. 4-6 or elsewhere herein and vice versa.

At 1102, the method 1100 may include providing an integrated circuit (IC) substrate. The IC substrate may include, for example, a die, wafer, package substrate, circuit board, or any other suitable IC substrate.

At 1104, the method 1100 may include depositing a solderable material on the IC substrate using a binder printing system. For example, in some embodiments, solder powder may be spread on the IC substrate and a binder material may be selectively deposited (e.g., dispensed) on the solder powder to form one or more scaffold structures of the solder powder held together by the binder material at locations on the IC substrate where one or more solder bumps are to be formed. Solder powder that is not held together by the binder material may be removed. The actions of spreading the solder powder on the IC substrate, depositing the binder material and removing the excess solder powder may be performed iteratively until a desired dimension (e.g., height) of the one or more scaffold structures is achieved. In some embodiments, the binder material may include a sacrificial tack binder that is stable at room temperature and configured to decompose during a reflow process. Other actions described in connection with FIGS. 4-6 or elsewhere herein may be performed.

At 1106, the method 100 may include reflowing the deposited solderable material to form one or more solder bumps on the IC substrate. The reflow process may comport with embodiments described in connection with FIG. 6 or elsewhere herein.

Figure 12:
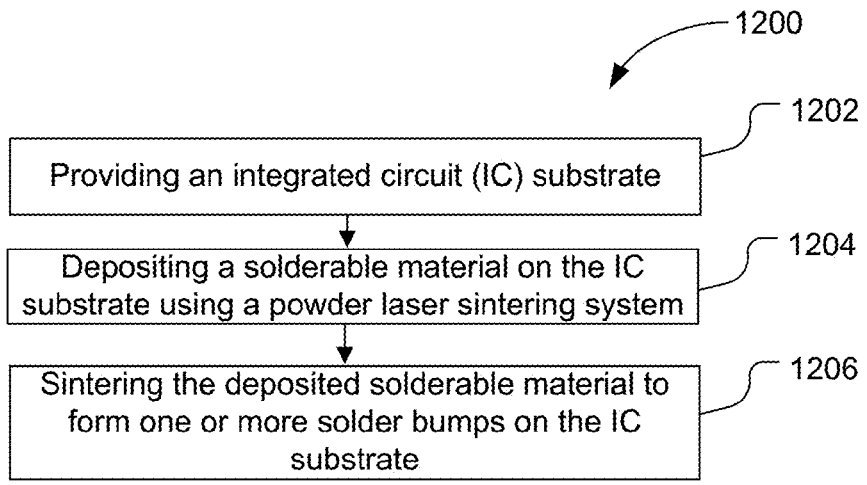
FIG. 12 schematically illustrates a flow diagram for a method of forming one or more solder bumps on an integrated circuit (IC) substrate using a powder laser sintering system, in accordance with some embodiments.

FIG. 12 schematically illustrates a flow diagram for a method 1200 of forming one or more solder bumps (e.g., solder bumps 904 of FIG. 9) on an integrated circuit (IC) substrate (e.g., work piece 202 of FIG. 9) using a powder laser sintering system (e.g., systems 700 or 800 of respective FIG. 7 or 8), in accordance with some embodiments. The method 1200 may comport with embodiments described in connection with FIGS. 7-9 or elsewhere herein and vice versa.

At 1202, the method 1200 may include providing an integrated circuit (IC) substrate. The IC substrate may include, for example, a die, wafer, package substrate, circuit board, or any other suitable IC substrate.

At 1204, the method 1200 may include depositing a solderable material on the IC substrate using a powder laser sintering system. In some embodiments, the solderable material may be deposited using a powder-jet laser sintering system (e.g., powder-jet laser sintering system 700 of FIG. 7). Solder powder may be selectively deposited to a sintering area in a path of a laser at locations where one or more solder bumps are to be formed. In some embodiments, the solderable material may be deposited using a powder-bed laser sintering system (e.g., powder-bed laser sintering system 800 of FIG. 8). Solder powder may be spread over the IC substrate, which may be disposed in a bed.

At 1206, the method 1200 may include sintering (e.g., by a laser) the deposited solderable material to form one or more solder bumps on the IC substrate. In embodiments where the solderable material is deposited by the powder-jet laser sintering system, the solder powder may be selectively deposited at the sintering area simultaneous with sintering of the solder powder as it is applied. In some embodiments, sintering may be performed in the presence of a reducing gas that is used to deliver the solder powder to the sintering area. Excess solder powder may be removed from the IC substrate subsequent to the sintering.

Figure 13:
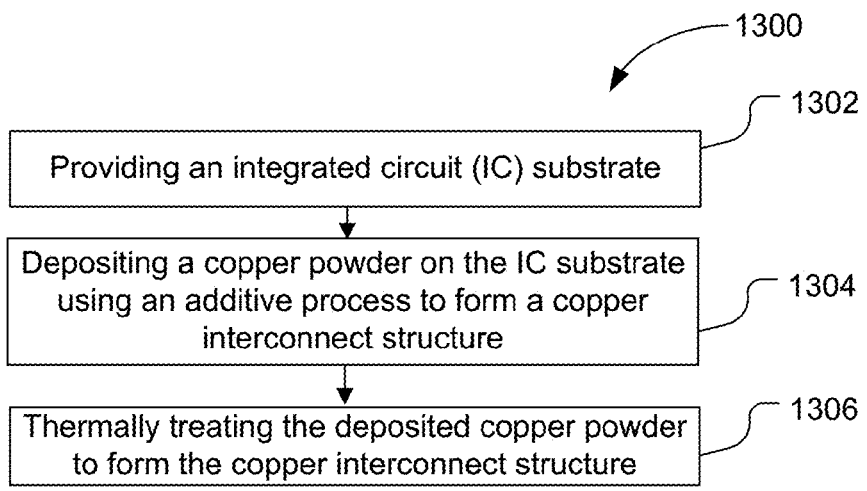
FIG. 13 schematically illustrates a flow diagram for a method of forming a copper interconnect structure on an integrated circuit (IC) substrate using an additive process, in accordance with some embodiments.

FIG. 13 schematically illustrates a flow diagram for a method of forming a copper interconnect structure on an integrated circuit (IC) substrate using an additive process, in accordance with some embodiments. The method 1300 may comport with embodiments described herein and vice versa.

At 1302, the method 1300 may include providing an integrated circuit (IC) substrate. The IC substrate may include, for example, a die, wafer, package substrate, circuit board, or any other suitable IC substrate.

At 1304, the method 1300 may include depositing a copper powder on the IC substrate using an additive process to form a copper interconnect structure. In some embodiments, the copper powder may be deposited in a carrier fluid by an ink printing process (e.g., ink jet or aerosol jet). In some embodiments, depositing the copper powder is performed using a powder-jet laser sintering system to deposit the copper powder. Other suitable techniques to deposit the copper powder may be used in other embodiments.

At 1306, the method 1300 may include thermally treating the deposited copper powder to form the copper interconnect structure. In some embodiments, the deposited copper powder may be cured to form the copper interconnect structure. For example, curing may be used in embodiments where the copper is deposited by an ink printing process. In some embodiments, the curing may be performed in a reducing atmosphere (e.g., formic acid). In some embodiments, the deposited copper may be sintered to form the copper interconnect structures. For example, sintering may be used in embodiments where the copper is deposited by a powder-jet laser sintering system. In some embodiments, the sintering may be performed in the presence of a reducing agent entrained in a gas flow of the copper powder during deposition of the copper powder. In some embodiments, the sintering may be performed in the presence of an adhesion promoter to promote adhesion of the sintered copper interconnect structures to the IC substrate. Various operations in the methods of FIGS. 10-13 are described as multiple discrete operations in turn, in a manner that is most helpful in understanding the claimed subject matter. However, the order of description should not be construed as to imply that these operations are necessarily order dependent.

Figure 14:
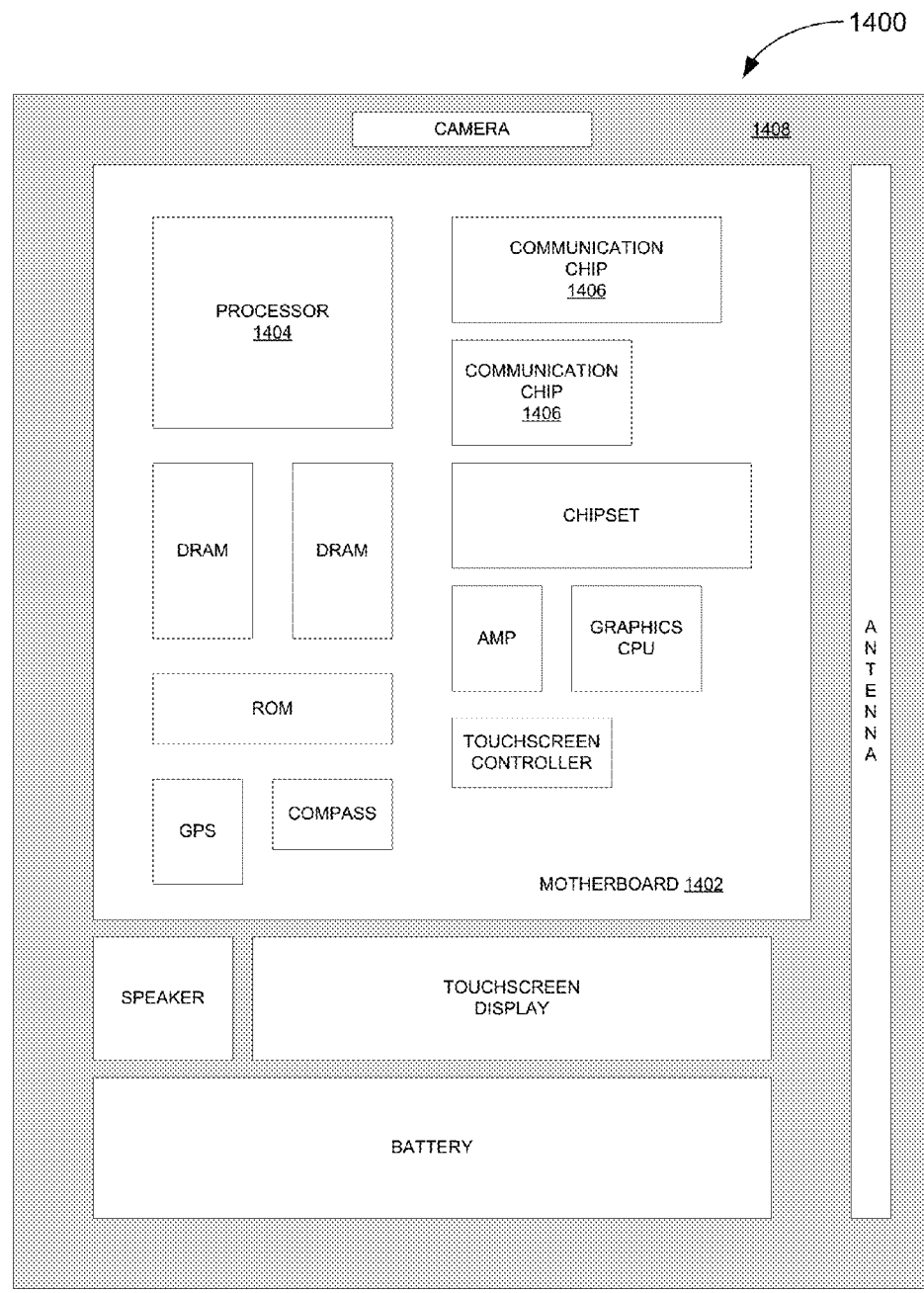
FIG. 14 schematically illustrates a computing device that includes an IC package assembly as described herein, in accordance with some embodiments.

Embodiments of the present disclosure may be implemented into a system (e.g., computing device 1400 of FIG. 14) using any suitable hardware and/or software to configure as desired. FIG. 14 schematically illustrates a computing device 1400 that includes an IC package assembly as described herein, in accordance with some embodiments. The computing device 1400 may house a board such as motherboard 1402 (e.g., in housing 1408). The motherboard 1402 may include a number of components, including but not limited to a processor 1404 and at least one communication chip 1406. The processor 1404 may be physically and electrically coupled to the motherboard 1402. In some implementations, the at least one communication chip 1406 may also be physically and electrically coupled to the motherboard 1402. In further implementations, the communication chip 1406 may be part of the processor 1404.

Depending on its applications, computing device 1400 may include other components that may or may not be physically and electrically coupled to the motherboard 1402. These other components may include, but are not limited to, volatile memory (e.g., dynamic random access memory ((DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1406 may operate in accordance with other wireless protocols in other embodiments.

The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, EV-DO, and others.

The processor 1404 of the computing device 1400 may be packaged in an IC package assembly (e.g., IC package assembly 100 of FIG. 1) including solder or copper interconnect structures formed according to techniques described herein. For example, the circuit board 122 of FIG. 1 may be a motherboard 1402 and the processor 1404 may be a die 102 mounted on a package substrate 121 of FIG. 1 using solder bumps formed according to techniques described herein. The package substrate 121 and the motherboard 1402 may be coupled together using package-level interconnects such as solder structures formed according to techniques described herein. The processor, motherboard or package substrate may include copper traces or other copper structures formed according to techniques described herein. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 1406 may also include a die that may be packaged in an IC package assembly (e.g., IC package assembly 100 of FIG. 1) including solder or copper interconnect structures formed according to techniques described herein. In further implementations, another component (e.g., memory device or other integrated circuit device) housed within the computing device 1400 may include a die that may be packaged in an IC package assembly (e.g., IC package assembly 100 of FIG. 1) including solder or copper interconnect structures formed according to techniques described herein.

In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1400 may be a mobile computing device in some embodiments. In further implementations, the computing device 1400 may be any other electronic device that processes data.

EXAMPLES

According to various embodiments, the present disclosure describes several methods. Example 1 of a method may include providing an integrated circuit (IC) substrate and depositing a solderable material on the IC substrate using an ink deposition process. Example 2 may include the method of Example 1, wherein the solderable ink includes a solder powder mixed with a flux material. Example 3 may include the method of Example 2, further comprising reflowing the deposited solderable ink to form one or more solder bumps on the IC substrate. Example 4 may include the method of any of Examples 1-3, wherein the solderable ink includes a solder powder mixed with a stabilizing binder that is stable at room temperature and configured to decompose at an elevated temperature above the room temperature. Example 5 may include the method of any of Examples 1-3, wherein the IC substrate includes a contact, wherein providing the IC substrate comprises providing a die, wafer, or package substrate and wherein depositing the solderable material comprises depositing the solderable material on the contact using an ink jet printer or aerosol jet printing system according to a computer-aided design (CAD) file. Example 6 of a method may include providing an integrated circuit (IC) substrate and depositing a solderable material on the IC substrate using a binder printing system. Example 7 may include the method of Example 6, wherein depositing the solderable material comprises spreading solder powder on the IC substrate and selectively depositing a binder material on the solder powder to form one or more scaffold structures of the solder powder held together by the binder material at locations on the IC substrate where one or more solder bumps are to be formed. Example 8 may include the method of Example 7, further comprising removing solder powder that is not held together by the binder material and iteratively performing actions of spreading the solder powder, selectively depositing the binder material and removing the solder powder until a desired dimension of the one or more scaffold structures is achieved. Example 9 may include the method of Example 7, wherein the binder material comprises a sacrificial tack binder that is stable at room temperature and configured to decompose at an elevated temperature above the room temperature. Example 10 may include the method of any of Examples 6-9, further comprising reflowing the deposited solderable material to form one or more solder bumps on the IC substrate. Example 11 of a method may include providing an integrated circuit (IC) substrate and depositing a solderable material on the IC substrate using a powder laser sintering system. Example 12 may include the method of Example 11, wherein depositing the solderable material on the IC substrate is performed using a powder-jet laser sintering system by selectively depositing solder powder to a sintering area in a path of a laser at locations where one or more solder bumps are to be formed. Example 13 may include the method of Example 12, further comprising sintering the deposited solderable material using the laser to form the one or more solder bumps on the IC substrate. Example 14 may include the method of Example 13, wherein the sintering is performed in the presence of a reducing agent in a gas that is used to deliver the solder powder to the sintering area. Example 15 may include the method of Example 11, wherein depositing the solderable material on the IC substrate is performed using a powder-bed laser sintering system by spreading solder powder on the IC substrate, the IC substrate being disposed in a bed. Example 16 may include the method of Example 15, further comprising sintering, by a laser, the deposited solderable material at locations on the IC substrate to form one or more solder bumps at the locations. Example 17 may include the method of Example 16, further comprising subsequent to the sintering, removing excess solder powder from the IC substrate. Example 18 may of a method comprising may include providing an integrated circuit (IC) substrate and depositing a copper powder on the IC substrate using an additive process to form a copper interconnect structure. Example 19 may include the method of Example 18, wherein depositing the copper powder comprises using an ink printing process to deposit the copper powder in a carrier fluid on the IC substrate. Example 20 may include the method of Example 19, further comprising curing the deposited copper powder to form the copper interconnect structure. Example 21 may include the method of Example 20, wherein the curing is performed in a reducing atmosphere comprising formic acid. Example 22 may include the method of Example 18, wherein depositing the copper powder comprises using a powder-jet laser sintering system to deposit the copper powder. Example 23 may include the method of Example 18, further comprising sintering the copper powder with a laser to form the copper interconnect structures. Example 24 may include the method of Example 23, wherein the sintering is performed in the presence of a reducing agent entrained in a gas flow of the copper powder during the depositing of the copper powder. Example 25 may include the method of Example 23, wherein the sintering is performed in the presence of an adhesion promoter to promote adhesion of the sintered copper interconnect structures to the IC substrate. Example 26 may include a product fabricated according to the method of any of the preceding Examples. Other examples may include apparatus and/or systems such as dies or IC substrates such as package substrate or circuit boards that include solder bumps or copper traces formed according to techniques herein or including features described herein.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
    providing an integrated circuit (IC) substrate;
    depositing a solderable ink on the IC substrate using an ink deposition process, wherein the solderable ink includes a solder powder mixed with a no residue flux (NRF) material that includes a base polymer of polyarylene carbonate (PAC) material and a formic acid fluxing agent; and
    reflowing the deposited solderable ink to form one or more solder bumps on the IC substrate, wherein a first solder bump of the one or more solder bumps has a size that is different than a size of a second solder bump of the one or more solder bumps.

2. The method of claim 1, wherein the solderable ink includes a solder powder mixed with a stabilizing binder that is stable at room temperature and configured to decompose at an elevated temperature above the room temperature.

3. The method of claim 1, wherein:
    the IC substrate includes a contact;
    providing the IC substrate comprises providing a die, wafer, or package substrate; and
    depositing the solderable ink comprises depositing a solderable material on the contact using an ink jet printer according to a computer-aided design (CAD) file.

4. The method of claim 1, wherein:
    the IC substrate includes a contact;
    providing the IC substrate comprises providing a die, wafer, or package substrate; and
    depositing the solderable ink comprises depositing a solderable material on the contact using an aerosol jet printing system according to a computer-aided design (CAD) file.

* * * * *